United States Patent
Lin et al.

(10) Patent No.: US 10,096,580 B2
(45) Date of Patent: Oct. 9, 2018

(54) ILLUMINATION ASSEMBLY, METHOD OF MANUFACTURING THE ILLUMINATION ASSEMBLY, AND BACKLIGHT MODULE INCLUDING THE ILLUMINATION ASSEMBLY

(71) Applicant: Taiwan Green Point Enterprises Co., Ltd., Taichung (TW)

(72) Inventors: Yu-Chuan Lin, Taichung (TW); Pen-Yi Liao, Taichung (TW); Hui-Ching Chuang, Taichung (TW); Chih-Hao Chen, Taichung (TW); Ai-Ling Lin, Taichung (TW)

(73) Assignee: TAIWAN GREEN POINT ENTERPRISES CO., LTD., Taichung (TW)

( * ) Notice: Subject to any disclaimer, the term of this patent is extended or adjusted under 35 U.S.C. 154(b) by 479 days.

(21) Appl. No.: 14/879,496

(22) Filed: Oct. 9, 2015

(65) Prior Publication Data

US 2016/0111401 A1   Apr. 21, 2016

(30) Foreign Application Priority Data

Oct. 15, 2014  (TW) .............................. 103135791 A

(51) Int. Cl.
*H01L 33/00* (2010.01)
*H01L 25/075* (2006.01)
*H01L 33/60* (2010.01)
*H01L 33/62* (2010.01)

(52) U.S. Cl.
CPC .......... *H01L 25/0753* (2013.01); *H01L 33/60* (2013.01); *H01L 33/62* (2013.01); *H01L 2924/0002* (2013.01); *H01L 2933/0066* (2013.01)

(58) Field of Classification Search
None
See application file for complete search history.

(56) References Cited

U.S. PATENT DOCUMENTS

| 2006/0131729 | A1* | 6/2006 | Lee | 257/700 |
| 2011/0079803 | A1* | 4/2011 | Chiang | 257/98 |

* cited by examiner

*Primary Examiner* — Andrew Coughlin
(74) *Attorney, Agent, or Firm* — Volpe and Koenig, P.C.

(57) ABSTRACT

An illumination assembly includes a substrate, a wiring structure, a reflecting layer and a plurality of light-emitting diodes. The wiring structure is formed on a part of the substrate, and includes a catalyst layer covering the part of the substrate, and a conducting layer formed on the catalyst layer. The reflecting layer is formed on another part of the substrate that is exposed from the wiring structure. The light-emitting diodes are disposed on the wiring structure and are electrically connected to the wiring structure.

5 Claims, 16 Drawing Sheets

ILLUMINATION ASSEMBLY, METHOD OF MANUFACTURING THE ILLUMINATION ASSEMBLY, AND BACKLIGHT MODULE INCLUDING THE ILLUMINATION ASSEMBLY

CROSS-REFERENCE TO RELATED APPLICATION

This application claims priority of Taiwanese Patent Application No. 103135791, filed on Oct. 15, 2014.

FIELD

Embodiments of the invention generally relate to an illumination assembly, a method of manufacturing the illumination assembly, and a backlight module including the illumination assembly.

BACKGROUND

A backlight module is a key element of liquid crystal display (LCD) panels. Since the liquid crystal in an LCD panel is not luminous, a backlight module is required to serve as a light source for the LCD panel.

Referring to FIG. 1, a backlight module includes a back plate 11, a circuit board 12, a plurality of light-emitting diodes 13, a reflector 14, a light guide plate 15, at least one diffuser plate 16 and at least one brightness enhancement film 17.

The light-emitting diodes 13 are disposed on and electrically connected to the circuit board 12. The circuit board 12 is connected to the back plate 11 by screws. The reflector 14 covers a part of the circuit board 12 that is exposed from the light-emitting diodes 13. In other words, the reflector 14 is formed with a plurality of through holes 141, each of which corresponds in position to a respective one of the light-emitting diodes 13.

During assembly of the backlight module, it is essential to precisely align the reflector 14 with the circuit board 12 so as to respectively receive the light-emitting diodes 13 in the through holes 141. The alignment procedure is time consuming and associated with increased manufacturing costs. In the event that the reflector 14 is misaligned with the circuit board 12, the reflector 14 may become deformed or damaged, resulting in lower production yields.

Moreover, the multi-layered structure of the back plate 11, the circuit board 12, and the reflector 14 makes the backlight module relatively bulky, and fails to meet market trends that favor thin and lightweight designs. Furthermore, during operation of the backlight module, the light-emitting diodes 13 generate massive amounts of heat. If the heat is not properly dissipated, lighting efficiency and the lifetime of the light-emitting diodes 13 may be adversely affected.

Accordingly, it is desirable to provide a backlight module with reduced thickness, improved heat dissipation, simplified manufacturing processes and reduced manufacturing costs so as to cater to the market trend.

SUMMARY

In certain embodiments of the disclosure, an illumination assembly includes a substrate, a wiring structure, a reflecting layer and a plurality of light-emitting diodes. The wiring structure is formed on a part of the substrate and includes a catalyst layer covering the part of the substrate, and a first conducting layer formed on the catalyst layer. The reflecting layer is formed on another part of the substrate exposed from the wiring structure. The light-emitting diodes are disposed on the wiring structure and are electrically connected to the wiring structure. In certain embodiments, a backlight module including the illumination assembly and an optical unit is provided. The optical unit is formed on the illumination assembly and includes a brightness enhancement film.

In certain embodiments of the disclosure, a method of manufacturing an illumination assembly includes the following steps:

providing a substrate;

forming on the substrate a catalyst layer that covers a part of the substrate;

forming a conducting layer on the catalyst layer by an electroless plating technique;

forming a reflecting layer on another part of the substrate exposed from the conducting layer; and providing a plurality of light-emitting diodes that are disposed on the conducting layer and electrically connected to the conducting layer.

In certain embodiments of the disclosure, an illumination assembly includes a substrate, a wiring structure, a reflecting layer and a plurality of light-emitting diodes. The wiring structure includes a catalyst layer formed on the substrate, a blocking layer covering a part of the catalyst layer, and a conducting layer formed on another part of the catalyst layer that is exposed from the blocking layer. The reflecting layer is formed on the blocking layer. The light-emitting diodes are disposed on the conducting layer and are electrically connected to the conducting layer.

In certain embodiments of the disclosure, a backlight module includes a substrate, a wiring structure, a plurality of light-emitting diodes and an optical unit. The wiring structure is formed on the substrate and includes a catalyst layer covering a part of the substrate, and a conducting layer formed on the catalyst layer. The light-emitting diodes are disposed on the wiring structure and are electrically connected to the wiring structure.

BRIEF DESCRIPTION OF THE DRAWINGS

Other features and advantages of the disclosure will become apparent in the following detailed description of the exemplary embodiments with reference to the accompanying drawings, of which.

DETAILED DESCRIPTION OF THE EXEMPLARY EMBODIMENTS

Figure 1:
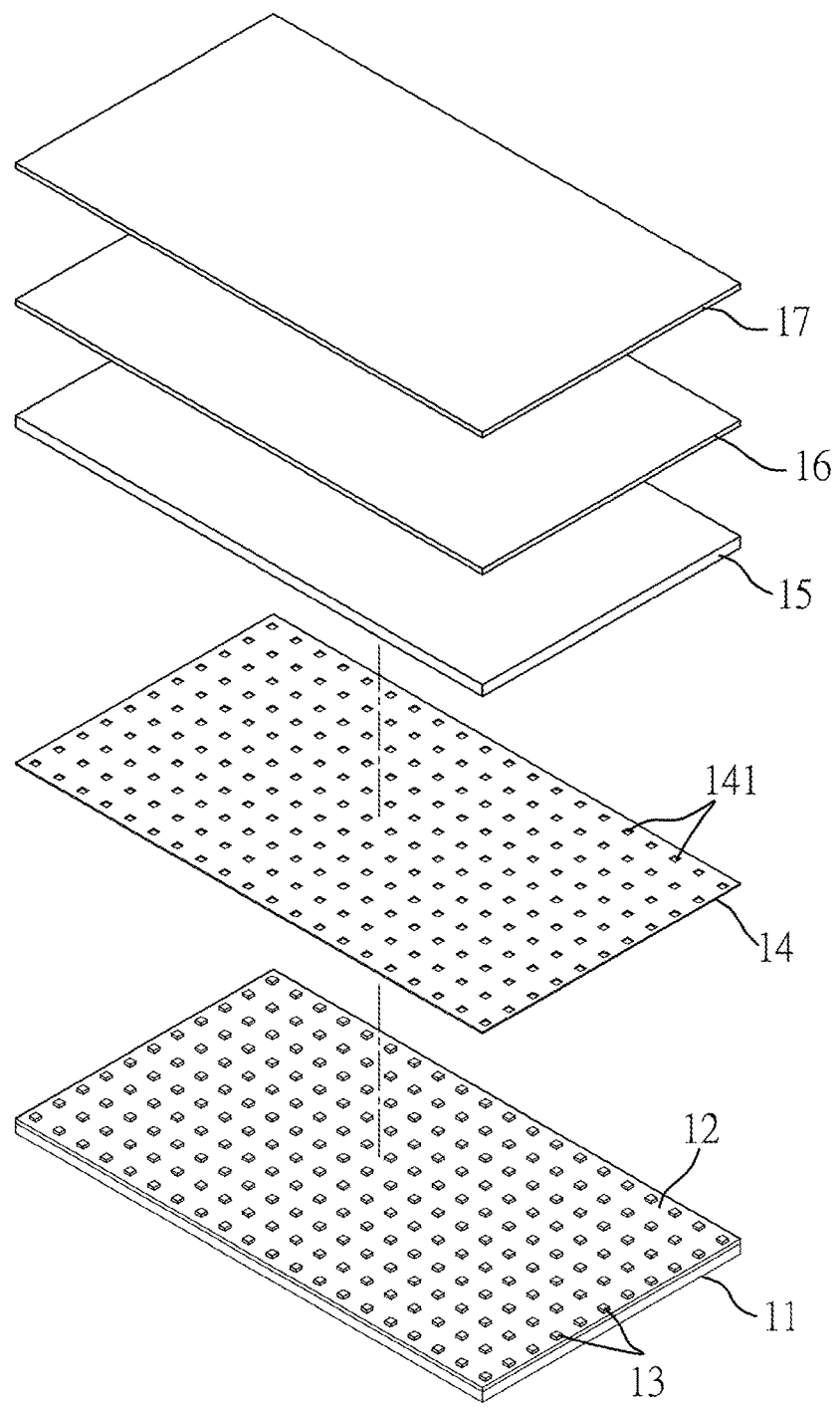
FIG. 1 is a perspective exploded view of a backlight module.

It may be noted that like elements are denoted by the same reference numerals throughout the disclosure.

Figure 2:
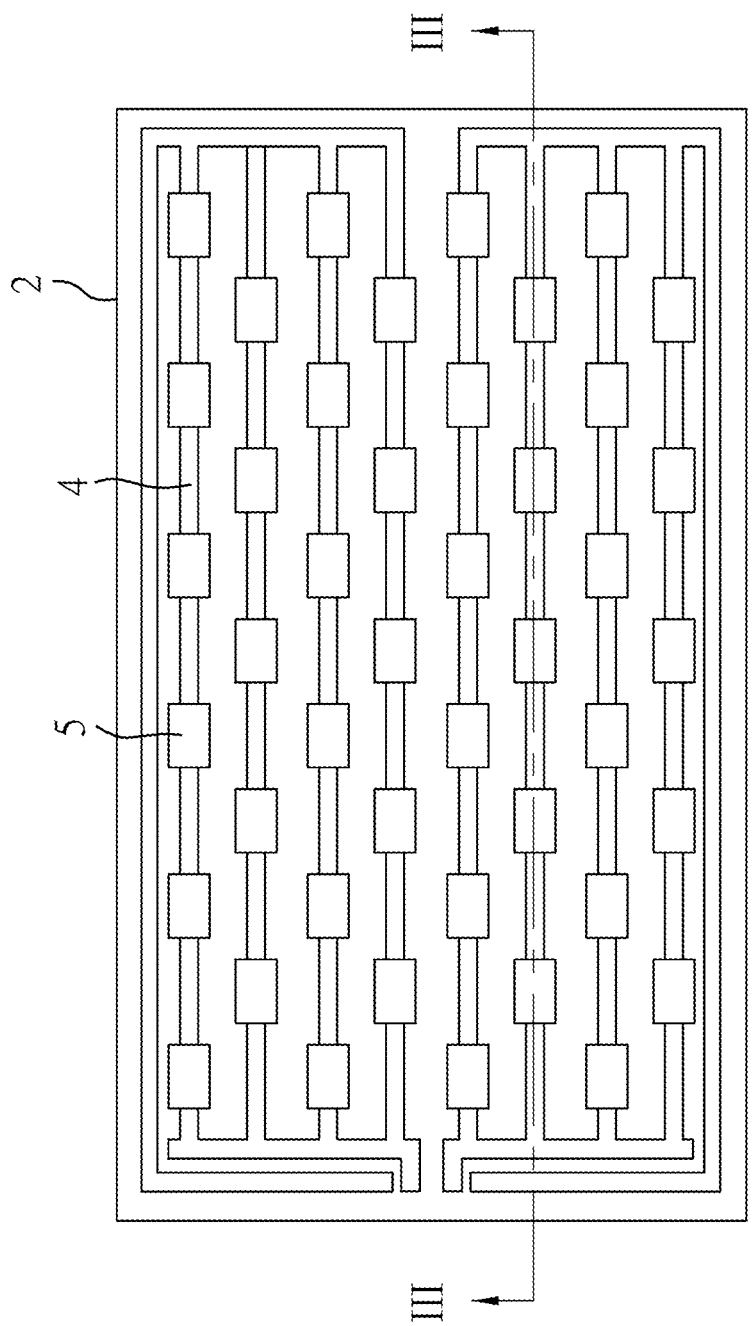
FIG. 2 is atop view of a first embodiment of an illumination assembly according to the present disclosure.
Figure 3:
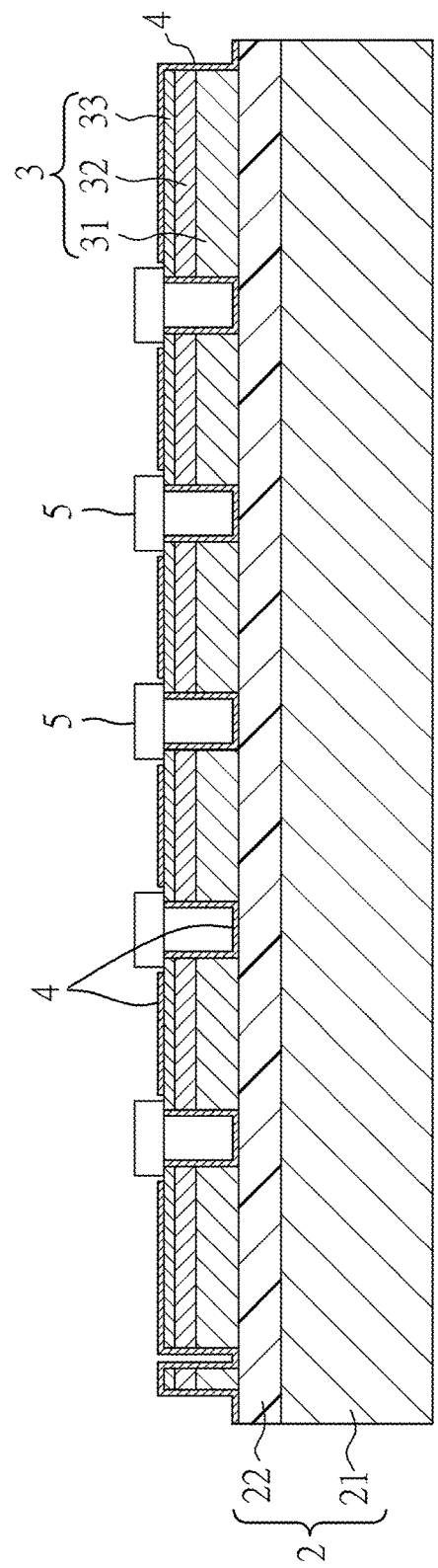
FIG. 3 is a partly cross-sectional view of the first embodiment taken along the line III-III of FIG. 2.

Referring to FIGS. 2 and 3, a first embodiment of an illumination assembly according to the present disclosure includes a substrate 2, a wiring structure 3, a reflecting layer 4 and a plurality of light-emitting diodes 5.

The substrate 2 includes a metal layer 21 and an insulating layer 22 formed on the metal layer 21. The metal layer 21 may be made of a metallic material that has superior thermal conductivity for facilitating heat dissipation. Examples of the metallic material include aluminum alloy, magnesium alloy, stainless steel, galvanized iron, and combinations thereof. The insulating layer 22 may be made of an insulating material, such as an epoxy resin, an acrylic resin, etc., and may have a thickness ranging from 15 µm to 25 µm.

It should be noted that the substrate 2 may be made entirely of an insulating material, so that a process of forming the insulating layer 22 on the metal layer 21 can be omitted, thereby simplifying the manufacturing process and reducing manufacturing costs. The wiring structure 3 is directly formed on the insulating substrate 2.

The wiring structure 3 is formed on and covers a part of the insulating layer 22 of the substrate 2. The wiring structure 3 includes a catalyst layer 31 that has a pattern and covers the part of the insulating layer 22, a first conducting layer 32 formed on the catalyst layer 31, and a second conducting layer 33 formed on the first conducting layer 32. The first and second conducting layers 32, 33 each have a pattern identical to that of the catalyst layer 31.

Specifically, the catalyst layer 31 may include, but is not limited to, a catalyst material selected from the group consisting of palladium, rhodium, osmium, iridium, platinum, gold, silver, copper, nickel, iron, and combinations thereof, and may have a thickness ranging from 15 µm to 30 µm. The first conducting layer 32 may include, but is not limited to, copper or nickel, and may have a thickness ranging from 6 µm to 12 µm. The second conducting layer 33 may include, but is not limited to, a material selected from the group consisting of platinum, silver, tin, gold, rhodium, palladium, and combinations thereof. The second conducting layer 33 may have a thickness ranging from 0.2 µm to 0.5 µm.

It should be specifically pointed out that, in the first embodiment, the insulating layer 22 is made of epoxy resin. In addition to the catalyst material, the catalyst layer 31 further includes a chemical compound that may be N-methyl-2-pyrrolidone, and is capable of slightly etching epoxy resin. The surface roughness of the insulating layer 22 is increased due to the etching effect of the chemical compound in the catalyst layer 31, thereby enhancing adhesion strength between the insulating layer 22 and the catalyst layer 31.

Moreover, different materials each have various degrees of resistance to chemical etching. The chemical compound included in the catalyst layer 31 may be changed according to the material of the insulating layer 22.

It should be noted that, in considering the process parameters, costs, and material of the first conducting layer 32, the second conducting layer 33 may be omitted accordingly. When the second conducting layer 33 is omitted, the wiring structure 3 only includes the catalyst layer 31 and the first conducting layer 32.

The reflecting layer 4 is made of a material including epoxy resin and titanium dioxide, and is formed on another part of the insulating layer 22 exposed from the wiring structure 3 and on a part of the second conducting layer 33. In certain embodiments, the reflecting layer 4 may be further formed on lateral sides of the wiring structure 3 (see FIG. 3). Since the second conducting layer 33 is not fully covered by the reflecting layer 4, the second conducting layer 33 exposed from the reflecting layer 4 can be used for electrical connection.

The light-emitting diodes 5 are disposed on and electrically connected to the wiring structure 3. In this embodiment, the light-emitting diodes 5 are separately disposed on and in contact with the second conducting layer 33 that is exposed from the reflecting layer 4, so as to electrically connect to the second conducting layer 33. An external electrical energy can be supplied to the light-emitting diodes 5 via the wiring structure 3. Since the materials and detailed structures of the light-emitting diodes 5 are well-known in the art and are not of the essence of the present disclosure, further description of the light-emitting diodes 5 will be omitted for the sake of brevity.

Figure 4:
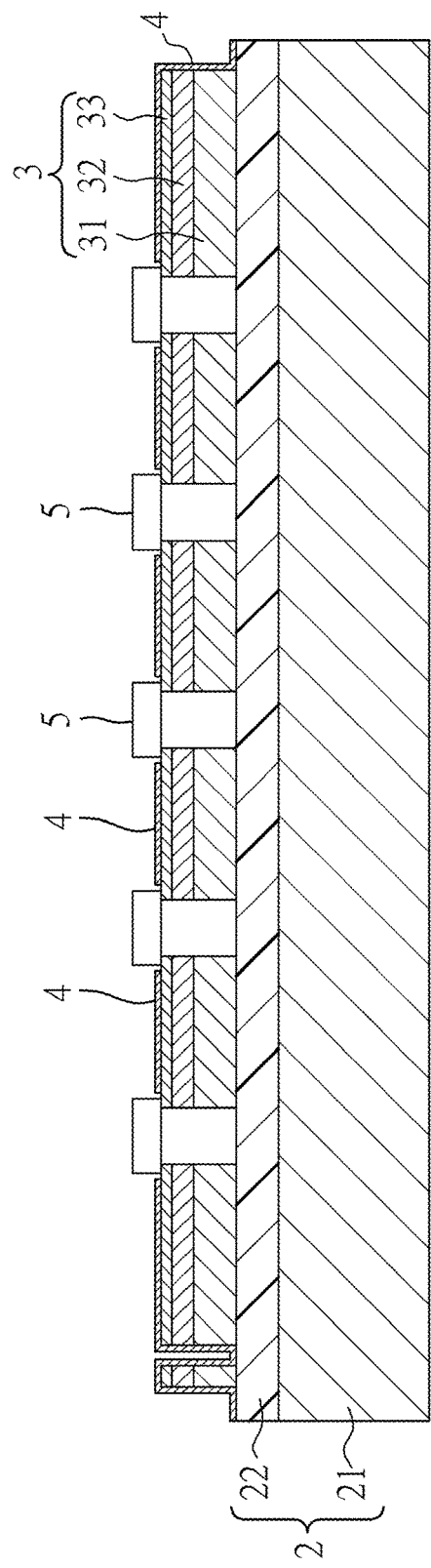
FIG. 4 is a partly cross-sectional view of a variation of the first embodiment.

Referring further to FIG. 4, in a variation of the first embodiment of the illumination assembly, a part of the reflecting layer 4 located on the lateral sides and on the another part of the insulating layer 22 exposed from the wiring structure 3 underneath the light-emitting diodes 5 is omitted, thereby increasing the positioning accuracy of the light-emitting diodes 5 during assembly.

Figure 5:
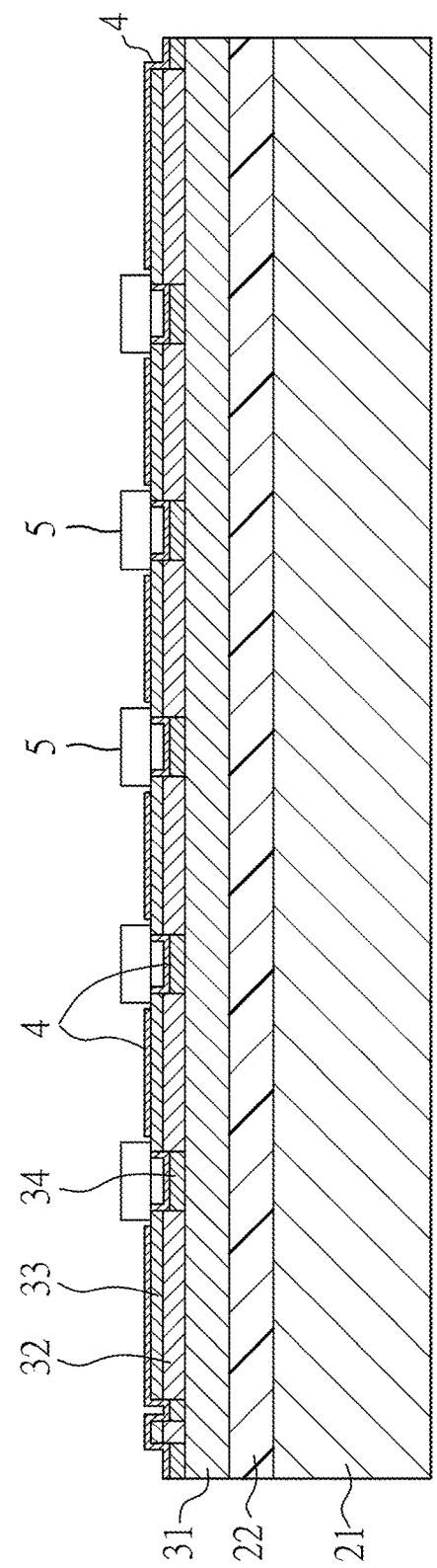
FIG. 5 is a partly cross-sectional view of a second embodiment of the illumination assembly according to the present disclosure.

Referring to FIG. 5, a second embodiment of the illumination assembly has a structure similar to that of the first embodiment, with differences described hereinafter. In the second embodiment, the wiring structure 3 of the illumination assembly further includes a blocking layer 34.

To be more specific, in the second embodiment, the catalyst layer 31 is formed on the insulating layer 22 of the substrate 2 (i.e., the catalyst layer 31 covers the entire surface of the insulating layer 22). The blocking layer 34 covers a part of the catalyst layer 31, and the first conducting layer 32 is formed on another part of the catalyst layer 31 that is exposed from and connected to the blocking layer 34. The second conducting layer 33 is formed on the first conducting layer 32. The reflecting layer 4 is formed on the blocking layer 34, the part of the second conducting layer 33, and the lateral sides of the wiring structure 3 (but not on the lateral side in contact with the blocking layer 34). The second conducting layer 33 has a pattern that is identical to that of the first conducting layer 32 and complementary to that of the blocking layer 34.

Figure 6:
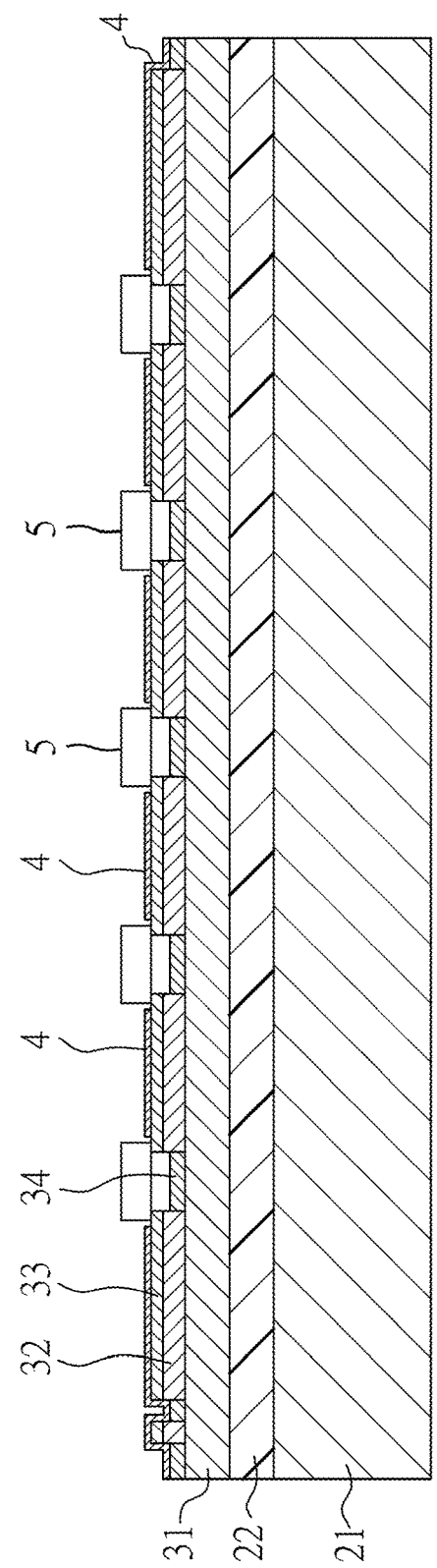
FIG. 6 is a partly cross-sectional view of a variation of the second embodiment.

Referring to FIG. 6, in a variation of the second embodiment of the illumination assembly, a part of the reflecting layer 4 located on the lateral sides and on the blocking layer 34 underneath the light-emitting diodes 5 is omitted, thereby increasing the positioning accuracy of the light-emitting diodes 5 during assembly.

In certain embodiments of the present disclosure, the reflecting layer 4 is used to replace the reflector 14 of the conventional backlight module. By direct formation of the reflecting layer 4, an alignment procedure for the reflector 14 can be omitted, thereby increasing production yield and saving on manufacturing costs. Moreover, by using the wiring structure 3 for supplying electrical energy to the light-emitting diodes 5, the first and second conducting layer 32, 33 made of metal with superior heat dissipation capability helps to improve operational stability and illumination efficiency of the light-emitting diodes 5. When the illumination assembly of the present disclosure is used in a backlight module, direct formation of the wiring structure 3 and the reflecting layer 4 on the substrate 2 makes the backlight module more thin and lightweight.

Figure 7:
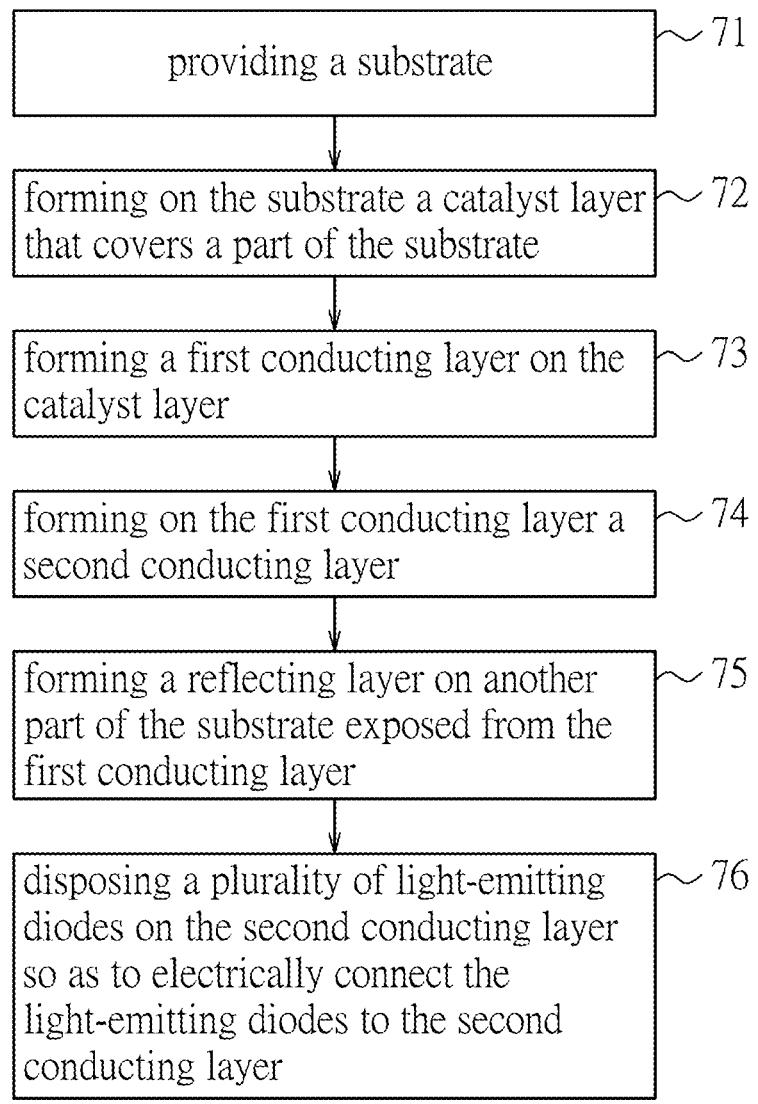
FIG. 7 is a flow chart showing a method of manufacturing the first embodiment.

Referring to FIG. 7, a method of manufacturing the first embodiment of the illumination assembly according to the present disclosure includes the following steps: providing the substrate 2 (Step 71); forming on the substrate 2 the catalyst layer 31 that covers a part of the substrate 2 (Step 72); forming the first conducting layer 32 on the catalyst layer 31 (Step 73); forming on the first conducting layer 32 the second conducting layer 33 (Step 74); forming the reflecting layer 4 on another part of the substrate 2 exposed from the first conducting layer 32 (Step 75); and disposing the light-emitting diodes 5 on the second conducting layer 32 so as to electrically connect the light-emitting diodes 5 to the second conducting layer 32 (Step 76).

Figure 8:
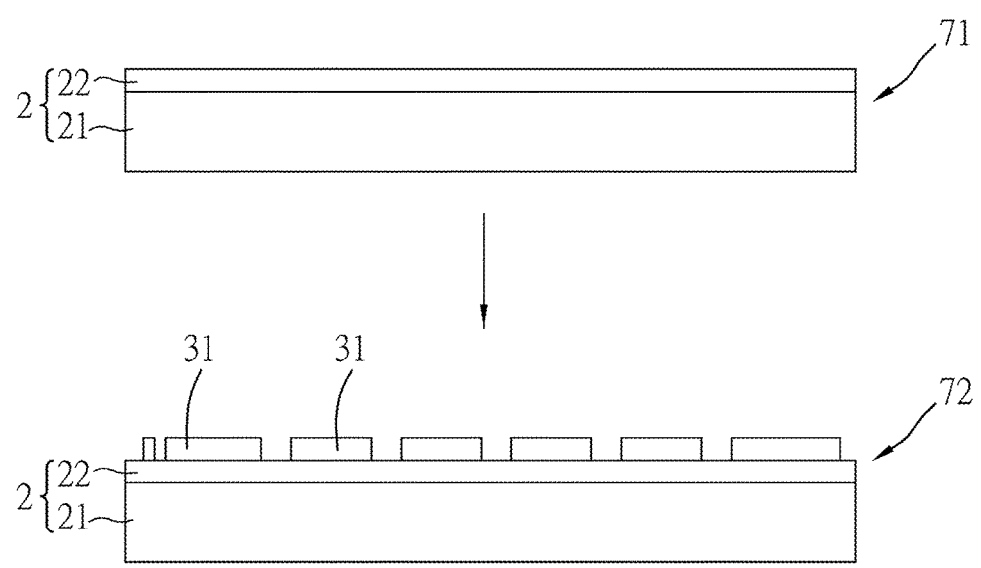
FIGS. 8 to 10 show consecutive steps of the method of manufacturing the first embodiment.

Referring further to FIG. 8, in Step 71, the insulating layer 22 is formed on the metal layer 21 by an electro-deposition coating technique so as to obtain the substrate 2 including the metal layer 21 and the insulating layer 22.

In Step 72, the catalyst layer 31 with a desired pattern is formed on the part of the insulating layer 22 by a screen printing technique.

It should be noted that the insulating layer 22 and the catalyst layer 31 may be formed by digital printing, spray coating, pad printing, transfer printing, immersion plating, coating technology, powder coating, etc., and should not be limited to the electro-deposition coating technique and the screen printing technique.

Figure 9:
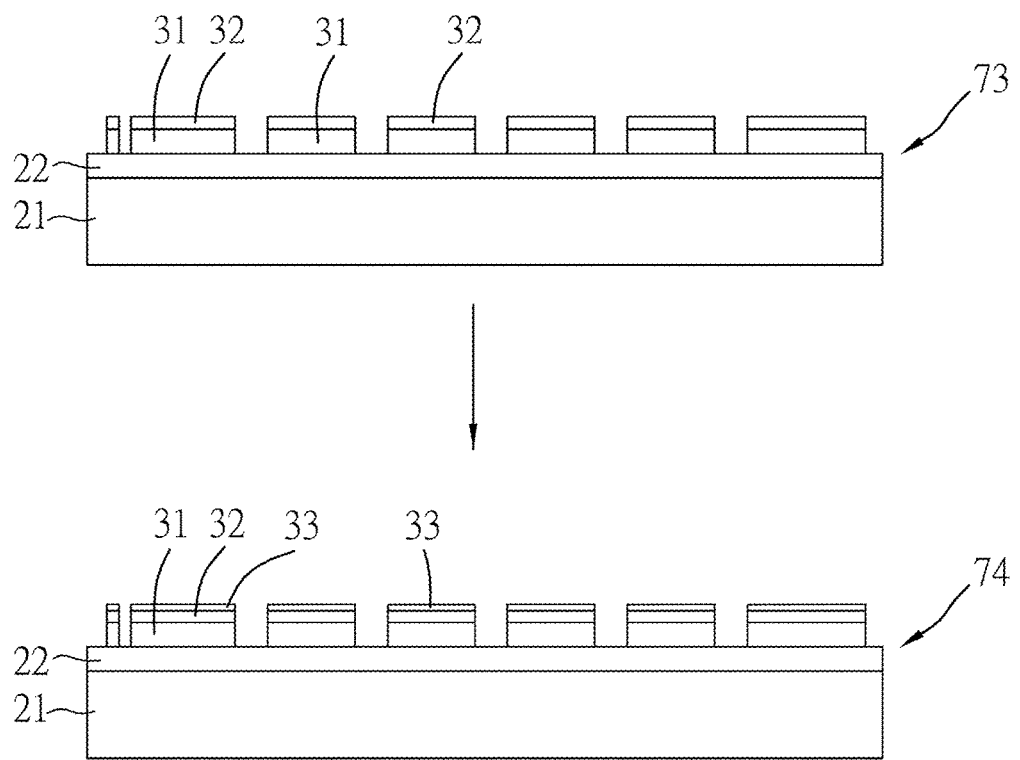

Referring further to FIG. 9, in Step 73, the first conducting layer 32 is formed on the catalyst layer 31 by the electroless plating technique. To be more specific, the substrate 2 formed with the catalyst layer 31 is submerged into a plating solution containing metal ions. The metal ions in the plating solution adhere to the catalyst layer 31 and are reduced into metal nuclei by the catalyst material in the catalyst layer 31. The ions in the plating solution are continuously reduced on the metal nuclei. Over a period of time, the first conducting layer 32 is formed on the catalyst layer 31 and develops a pattern identical to that of the catalyst layer 31.

In the method of manufacturing the first embodiment, the plating solution includes copper sulfate, thus the first conducting layer 32 formed by reduction of the metal ions in the plating solution includes copper. Since the electroless plating technique is well-known in the art, further description of the electroless plating technique will be omitted for the sake of brevity.

In Step 74, the second conducting layer 33 is formed on the first conducting layer 32 by the electroless plating technique. In Step 74, the plating solution may include silver nitrate, thus the second conducting layer 32 includes silver. The detailed process of the electroless plating technique is presented above and will not be described hereafter.

Note that, in Step 73 and Step 74, the first and second conducting layers 32, 33 may be formed by other techniques, such as sputtering coating, immersion coating, evaporation deposition, etc., and should not be limited to the techniques disclosed herein.

Figure 10:
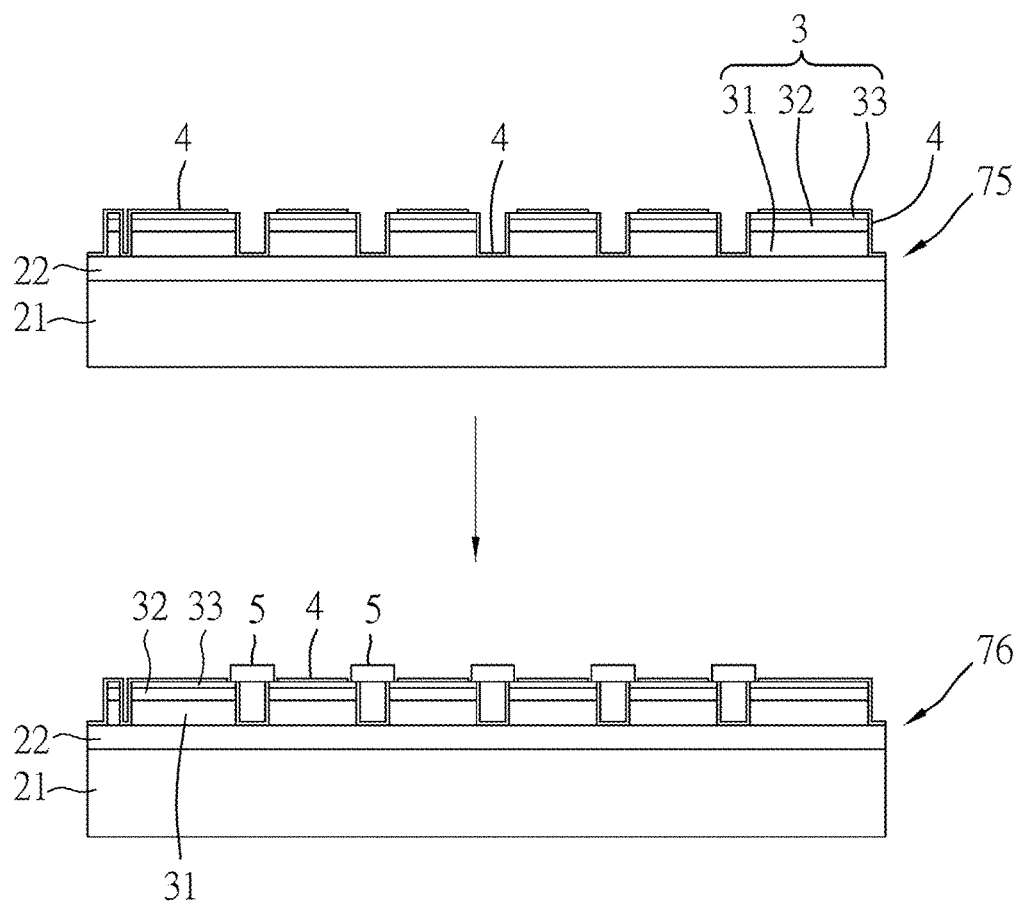

Referring further to FIG. 10, in Step 75, the reflecting layer 4 having a high reflection coefficient is formed on the another part of the insulating layer 22 that is exposed from the first conducting layer 32, the part of the second conducting layer 33, and the lateral sides of the wiring structure 3 by screen printing. The reflecting layer 4 may be formed by digital printing, spray coating, pad printing, transfer printing, immersion plating, coating technique, powder coating, etc., and should not be limited to the screen printing technique.

In Step 76, the light-emitting diodes 5 are separately disposed on and in contact with the another part of the second conducting layer 33 so as to electrically connect to the second conducting layer 33.

In a method of manufacturing the variation of the first embodiment, the reflecting layer 4 is not formed on the lateral sides of the wiring structure 3 and on the another part of the insulating layer 22 exposed from the wiring structure 3 underneath the light-emitting diodes 5, thereby increasing the positioning accuracy of the light-emitting diodes 5 during assembly.

Note that Step 74 may be omitted in the method of this disclosure. In other words, after Step 73 of forming the first conducting layer 32, Step 75 of forming the reflecting layer 4 is conducted. The process time and manufacturing costs would thus be reduced.

Figure 11:
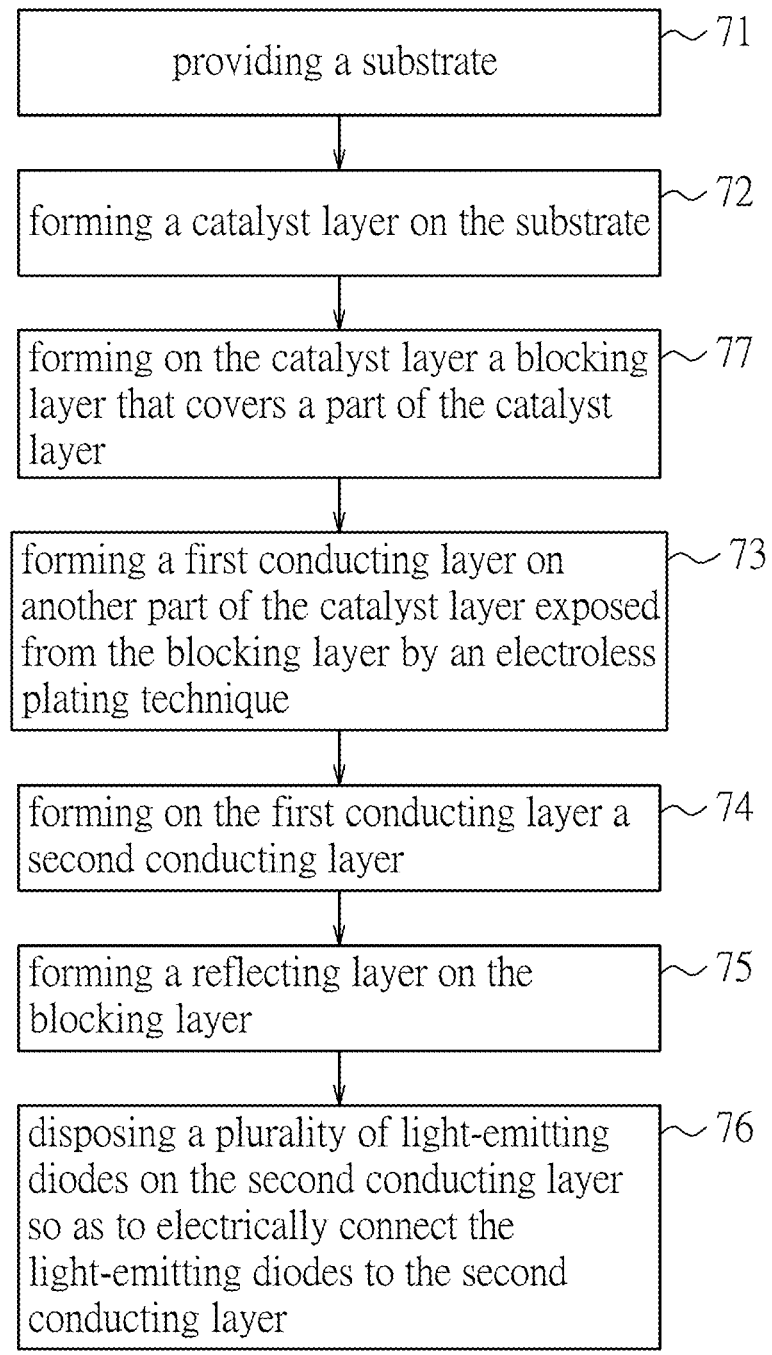
FIG. 11 is a flow chart showing a method of manufacturing the second embodiment.

Referring to FIG. 11, a method of manufacturing the second embodiment of the illumination assembly is similar to that of the first embodiment, with the difference being described hereinafter. The method of manufacturing the second embodiment further includes, after Step 72 and before Step 73, Step 77 of forming the blocking layer 34.

Figure 12:
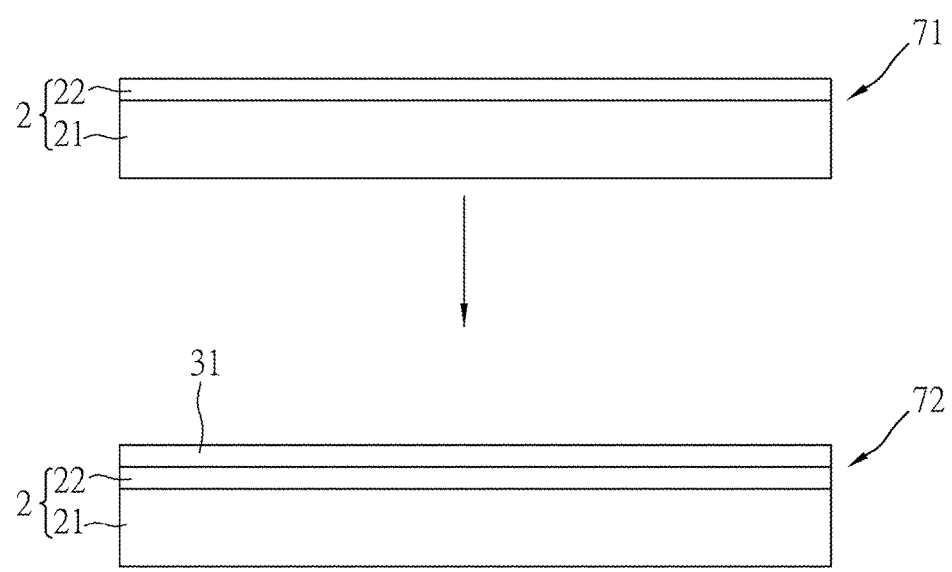
FIGS. 12 to 14 show consecutive steps of the method of manufacturing the second embodiment.
Figure 13:
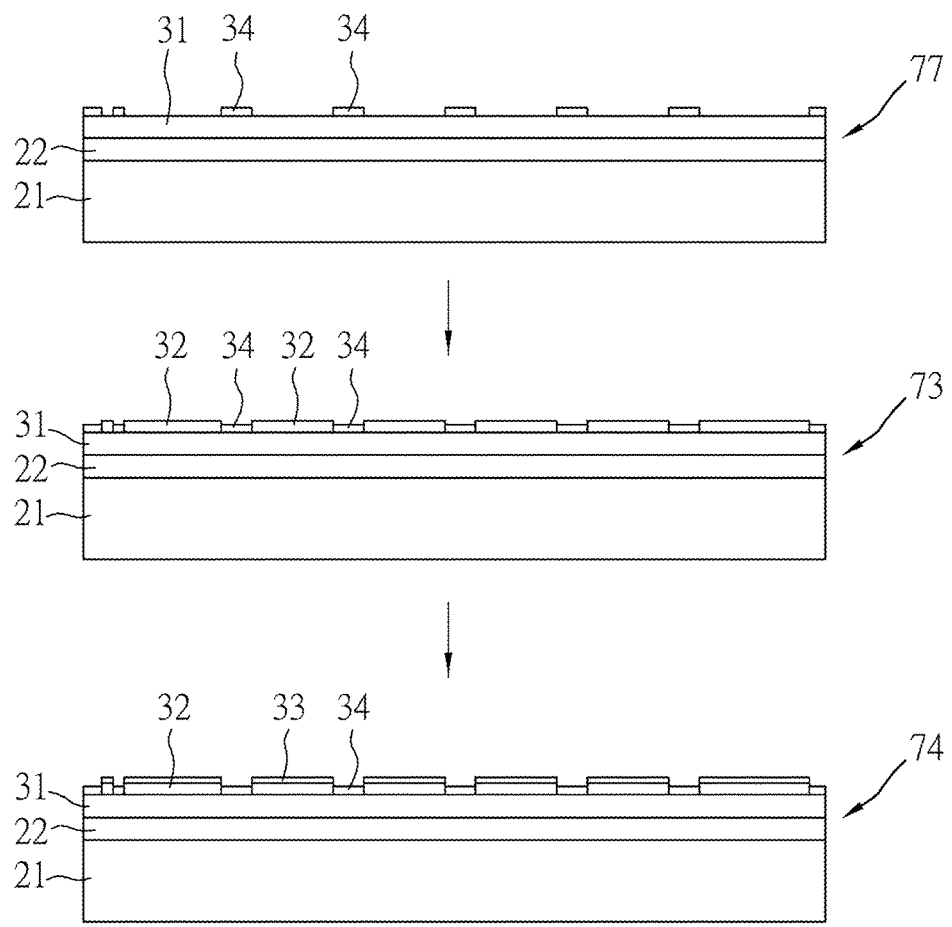

Referring further to FIGS. 12 and 13, in Step 71, the substrate 2 includes the metal layer 21 and the insulating layer 22 formed on the metal layer 21. In Step 72, the catalyst layer 31 is formed to cover the entire surface of the insulating layer 22 by spray coating. Then, in Step 77, the blocking layer 34 is formed on the part of the catalyst layer 31 by screen printing, followed by conducting Step 73 of forming the first conducting layer 32 on the another part of the catalyst layer 31 that is exposed from the blocking layer 34. The first conducting layer 32 is connected to the blocking layer 34. The first conducting layer 32 may be formed by the electroless plating technique. In Step 74, the second conducting layer 33 is formed on the first conducting layer 32 by the electroless plating technique. The second conducting layer 33 has a pattern that is identical to that of the first conducting layer 32 and complementary to that of the blocking layer 34.

Figure 14:
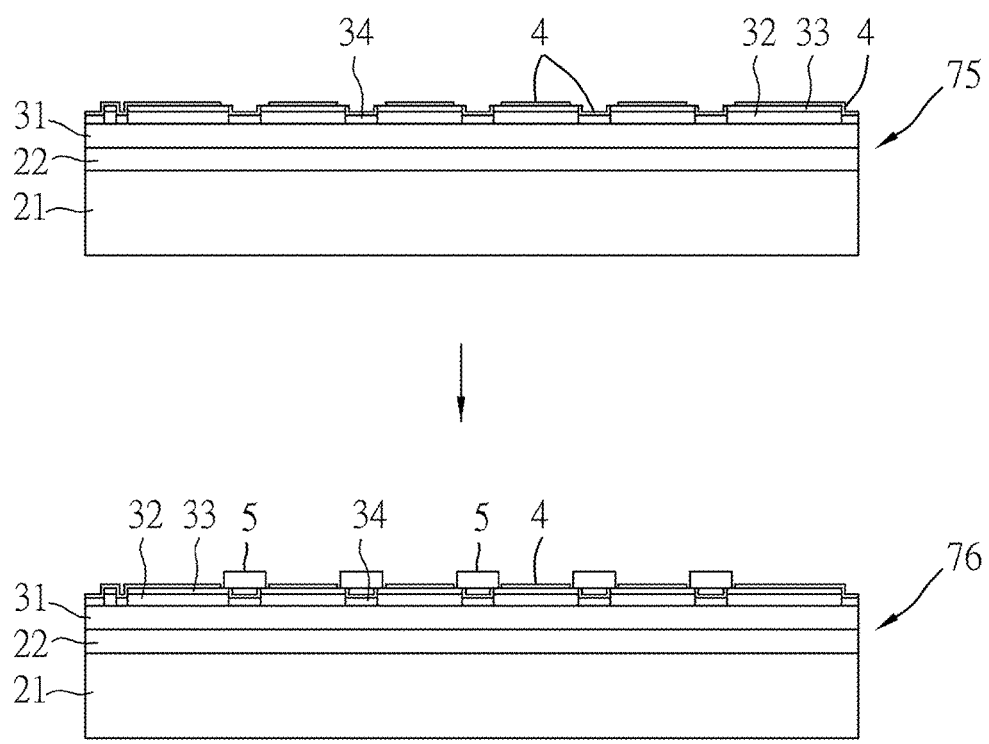

Referring further to FIG. 14, in Step 75, the reflecting layer 4 having a high reflection coefficient is formed on the blocking layer 34, the part of the second conducting layer 33, and the lateral sides of the wiring structure 3 (but not on the lateral side in contact with the blocking layer 34) by the screen printing technique. In Step 76, the light-emitting diodes 5 are separately disposed on and in contact with the second conducting layer 33 so as to electrically connect to the second conducting layer 33.

Note that, in a method of manufacturing the variation of the second embodiment, the reflecting layer is not formed on the lateral sides of the wiring structure 3 and on the blocking layer underneath the light-emitting diodes 5, thereby increasing the positioning accuracy of the light-emitting diodes 5.

In the present disclosure, the wiring structure 3 and the reflecting layer 4 may be directly formed on the substrate 2 by the techniques of screen printing, spray coating, electroless plating, etc. Compared to the conventional backlight module including the circuit board 12 and the reflector 14, the illumination assembly of the present disclosure has reduced thickness, higher production yield due to increased positioning accuracy, and reduced process time and manufacturing costs.

In general, the backlight module may be classified as bottom-lighting-type and edge-lighting-type, and may be configured according to practical requirements.

Figure 15:
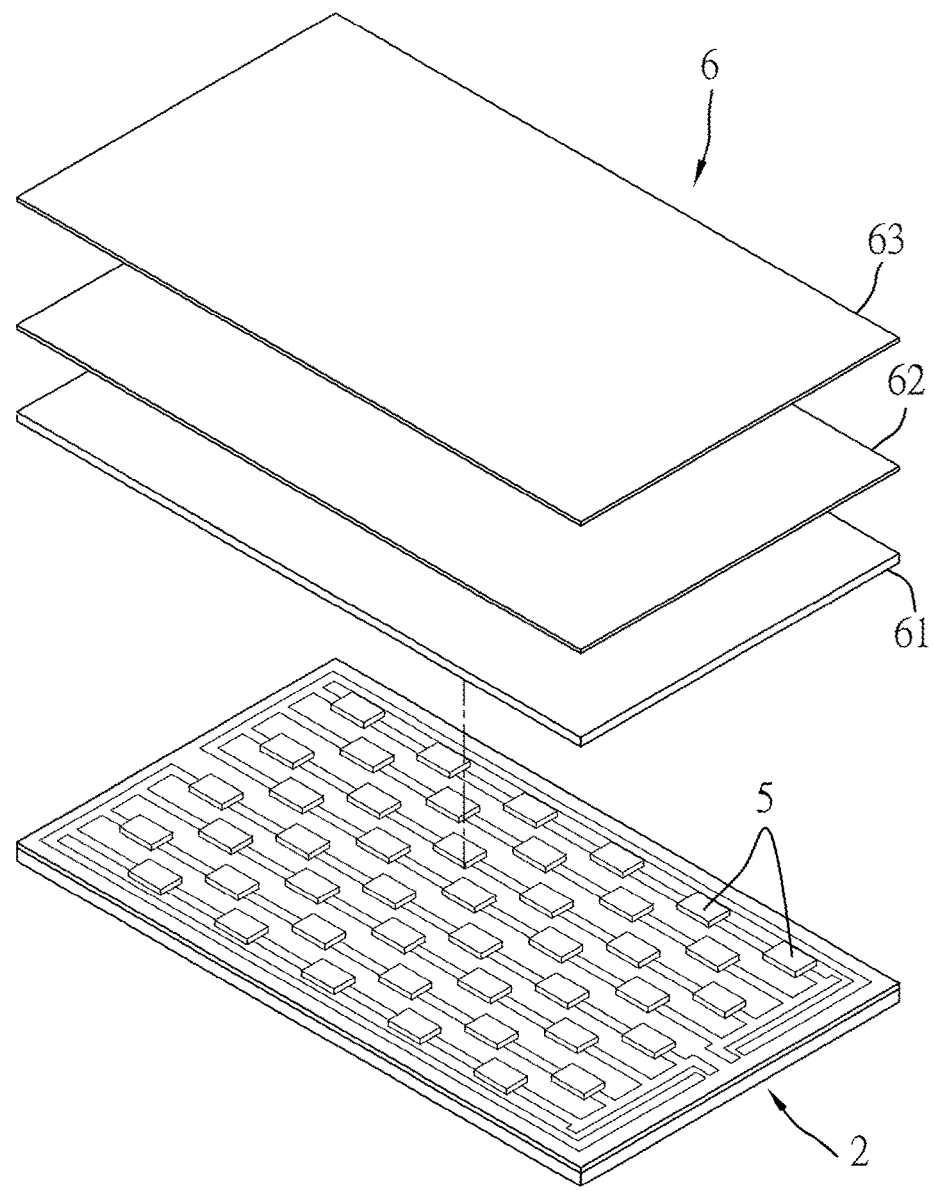
FIG. 15 is a partly exploded view of a bottom-lighting-type backlight module including the illumination assembly of the present disclosure.

Referring to FIG. 15, a bottom-lighting-type backlight module of the present disclosure includes the illumination assembly of the disclosure and an optical unit 6 formed on the illumination assembly. The optical unit 6 includes a light guide plate 61 disposed in proximity to the light-emitting diodes 5 of the illumination assembly, a brightness enhancement film 63 disposed on the light guide plate 61 opposite to the illumination assembly, and a diffuser plate 62 disposed between the brightness enhancement film 63 and the illumination assembly. The backlight module may be used in a liquid crystal display panel. In this embodiment, the backlight module further includes a casing (not shown) including the substrate 2. To be more specific, the substrate 2 constitutes a part of the casing, thereby saving manufacturing cost and reducing the overall size of the backlight module.

Figure 16:
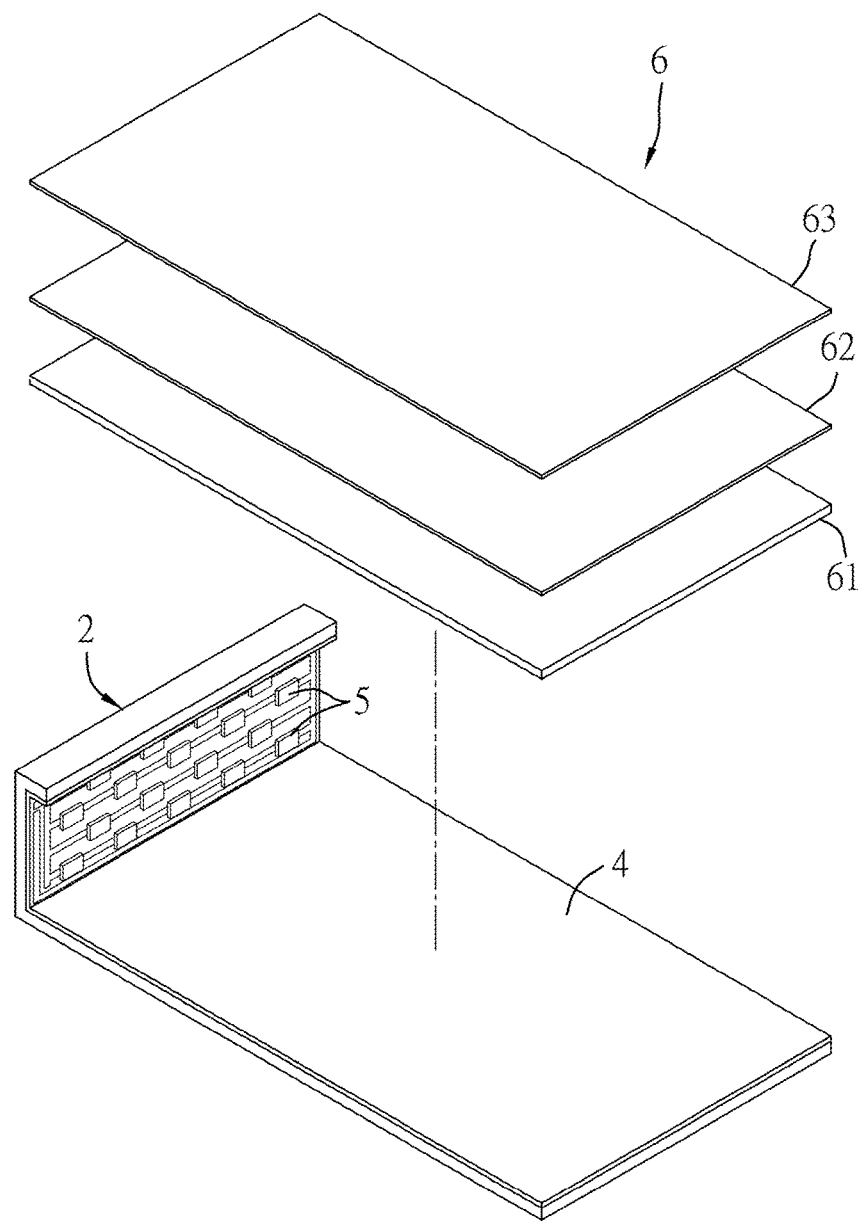
FIG. 16 is a partly exploded view of an edge-lighting-type backlight module including the illumination assembly of the present disclosure.

Referring to FIG. 16, an edge-lighting-type backlight module of the present disclosure includes the illumination assembly of this disclosure that is disposed at a side of the optical unit 6. In this embodiment, the backlight module further includes a casing (not shown) including the substrate 2. To be more specific, the substrate 2 constitutes a part of the casing, thereby saving manufacturing cost and reducing the overall size of the backlight module.

Since the materials and detailed structures of the optical unit 6 are well-known in the art and are not of the essence of the present disclosure, further description of the backlight module will be omitted for the sake of brevity.

To sum up, the reflecting layer 4 of the present disclosure is directly formed on the substrate 2 by screen printing, spray coating, electroless plating, etc., to replace the reflector 14 of the conventional backlight module. The alignment process for the reflector 14 can be omitted, thereby increasing production yield and saving on manufacturing costs of the illumination assembly of the present disclosure. When the illumination assembly of the present disclosure is used in a backlight module, direct formation of the reflecting layer 4 on the substrate 2 makes the backlight module more thin and lightweight.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method of manufacturing an illumination assembly, comprising the following steps:
   providing a substrate;
   forming on the substrate a catalyst layer that covers a part of the substrate;
   forming a first conducting layer on the catalyst layer by an electroless plating technique;
   forming a reflecting layer on another part of the substrate exposed from the first conducting layer and on lateral sides of the catalyst layer and the first conducting layer; and
   disposing a plurality of light-emitting diodes on the first conducting layer so as to electrically connect the plurality of light-emitting diodes to the first conducting layer,
   wherein a part of the reflecting layer, which is formed on the lateral sides of the catalyst layer and the first conducting layer, is located underneath the light-emitting diodes.

2. The method as claimed in claim 1, wherein:
   in the step of providing the substrate, the substrate is made of an insulating material; and
   in the step of forming the catalyst layer, the catalyst layer is directly formed on the substrate.

3. The method as claimed in claim 1, wherein:
   in the step of providing the substrate, the substrate includes a metal layer and an insulating layer formed on the metal layer; and
   in the step of forming the catalyst layer, the catalyst layer is formed on and covering a part of the insulating layer.

4. The method as claimed in claim 1, further comprising, before the step of forming the reflecting layer, a step of forming on the first conducting layer a second conducting layer,
   wherein, in the step of forming the reflecting layer, the reflecting layer is formed on the another part of the substrate that is exposed from the first conducting layer and on a part of the second conducting layer.

5. The method as claimed in claim 1, wherein, in the step of forming the reflecting layer, the reflecting layer is further formed on a part of the first conducting layer.

* * * * *